United States Patent
Yang et al.

(10) Patent No.: US 7,626,882 B2
(45) Date of Patent: Dec. 1, 2009

(54) FLASH MEMORY DEVICE WITH EXTERNAL HIGH VOLTAGE SUPPLY

(75) Inventors: Nian Yang, Mountain View, CA (US);
Yonggang Wu, Santa Clara, CA (US);
Aaron Lee, Mountain View, CA (US);
Wei Daisy Cai, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/613,383

(22) Filed: Dec. 20, 2006

(65) Prior Publication Data

US 2008/0151639 A1    Jun. 26, 2008

(51) Int. Cl.
*G11C 5/14* (2006.01)
(52) U.S. Cl. .................. 365/226; 365/227
(58) Field of Classification Search ............. 365/185.23, 365/226, 227, 185.33, 189.09, 189.11
See application file for complete search history.

(56) References Cited

U.S. PATENT DOCUMENTS

| | | | |
|---|---|---|---|
| 5,329,168 A * | 7/1994 | Sugibayashi et al. ........ 327/535 |
| 7,206,232 B2 * | 4/2007 | Kurosaki et al. ....... 365/185.25 |
| 7,345,916 B2 * | 3/2008 | Yang et al. ............. 365/185.14 |
| 7,355,904 B2 * | 4/2008 | Wu et al. ................ 365/189.09 |

* cited by examiner

*Primary Examiner*—Son T Dinh
*Assistant Examiner*—Hien N Nguyen (57) ABSTRACT

A semiconductor memory device (104) selectably connectable to an external high voltage power supply (122) is provided. The semiconductor memory device (104) includes a switch (314), a detector (316) and a timing device (318). The switch (314) is connected to external voltage supply signals and selectably couples the external voltage supply signals to memory cells (305) of the semiconductor memory device (104) for memory operations thereof. The external voltage supply signals including a high voltage signal (412) provided from the external high voltage power supply (122) and an operational voltage signal Vcc (402). The detector (316) is connected to the external voltage supply signals for generating a timer activation signal (404) in response to detecting an operational voltage power-on period. The timing device (318) signals the switch (314) to decouple the high voltage signal (412) and the operational voltage signal (402) from the memory cells (305) in response to the timer activation signal (404) and to recouple the high voltage signal (412) and the operational voltage signal (402) to the memory cells (305) a time delay interval thereafter. The time delay interval is determined in response to the high voltage signal (412).

20 Claims, 5 Drawing Sheets

FLASH MEMORY DEVICE WITH EXTERNAL HIGH VOLTAGE SUPPLY

FIELD OF THE DISCLOSURE

The present invention generally relates to semiconductor Flash memory devices, and more particularly relates to Flash memory devices utilizing high voltages for operation thereof.

BACKGROUND OF THE DISCLOSURE

High performance semiconductor Flash memory devices require high voltages to perform operations such as programming and erase on memory cells having gates thereof connected to word lines and sources and drains thereof connected to bit lines. Traditionally the high voltages are delivered from high voltage pumps called drain pumps on the semiconductor Flash memory devices. As the Flash memory devices' current capabilities and voltage requirements increase, such as Flash memory devices which require different high voltages to be placed on or switched at the word lines and the bit lines simultaneously, the area on the semiconductor Flash memory die and the power consumption required for such drain pumps substantially increase, affecting the overall performance of the semiconductor Flash memory device. To alleviate this problem, external, off-chip high voltage supply sources, such as a high voltage supply chip, can be used for supplying the high voltages to perform the Flash memory operations. However, while the external high voltage supply source can provide highly efficient high voltages and high currents, the incompatibility of the external high voltage supply source and the Flash memory die make it difficult for the Flash memory die to effectively use the off-chip high voltage supply source.

Accordingly, it is desirable to provide a method and apparatus for a semiconductor Flash memory die to effectively and efficiently use an off-chip high voltage source for high voltage operation of the Flash memory. Furthermore, other desirable features and characteristics of the present invention will become apparent from the subsequent detailed description of the invention and the appended claims, taken in conjunction with the accompanying drawings and this background of the invention.

BRIEF SUMMARY OF THE DISCLOSURE

A method is provided for performing a high voltage operation in a semiconductor memory device that is selectably connectable to an external high voltage power supply, the external high voltage power supply providing a high voltage signal to the semiconductor memory device for the high voltage operation. The method includes the steps of detecting a power-on period of an operational voltage signal provided to the semiconductor memory device, waiting a time delay interval after detection of the power-on period of the operational voltage, and connecting the high voltage signal and the operational voltage signal to memory cells of the semiconductor memory device after the time delay interval for performing memory operations of the semiconductor memory device. The time delay interval is determined in response to the high voltage signal.

A semiconductor memory device selectably connectable to an external high voltage power supply is also provided. The semiconductor memory device includes a switch, a detector and a timing device. The switch is connected to external voltage supply signals and selectably couples the external voltage supply signals to memory cells of the semiconductor memory device for memory operations thereof, the external voltage supply signals including a high voltage signal provided from the external high voltage power supply and an operational voltage signal. The detector is connected to the external voltage supply signals for generating a timer activation signal in response to detecting an operational voltage power-on period. And the timing device is coupled to the detector and the switch for signaling the switch to decouple the high voltage signal and the operational voltage signal from the memory cells in response to the timer activation signal and to recouple the high voltage signal and the operational voltage signal to the memory cells a time delay interval thereafter. The time delay interval is determined in response to the high voltage signal.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
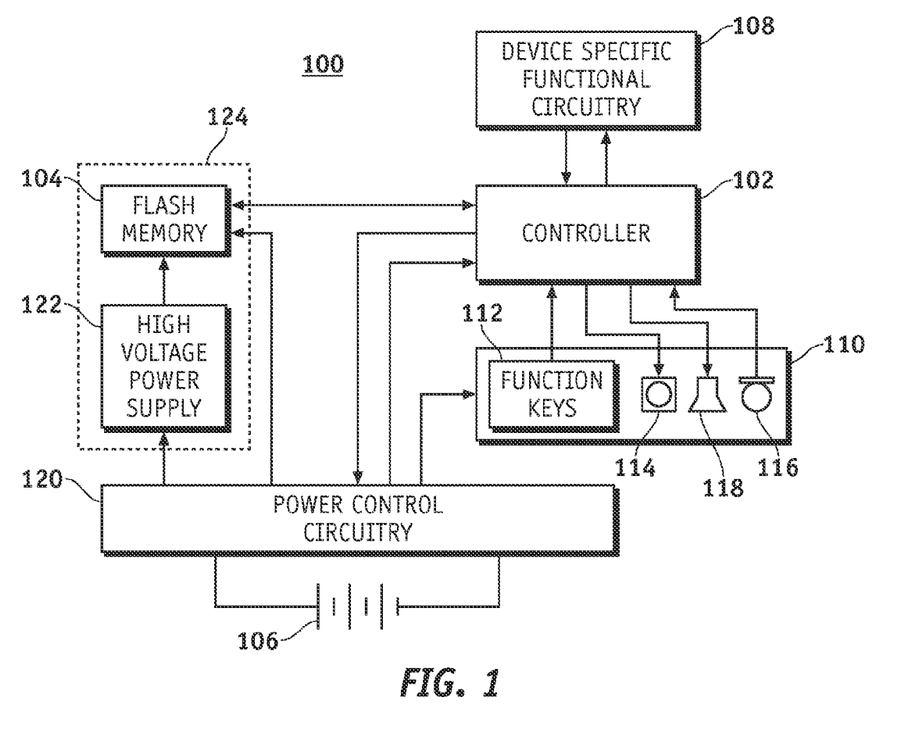
FIG. 1 is a block diagram of an electronic device utilizing a semiconductor memory device in accordance with an embodiment of the present invention.

Today, virtually all electronic devices utilize at least one type of memory device. FIG. 1 depicts a block diagram of an electronic device 100 including a controller 102 and a memory 104. The electronic device 100 could be either a wired device or, as depicted, a portable electronic device which includes an energy storage device 106, such as a battery. The electronic device 100 could be a cellular telephone, a computer, a personal digital assistant, an electronic control system for appliances such as a refrigerator or air conditioner, or an electronic control system for an automobile. The controller 102 can be a processor or microprocessor capable of executing instructions within predefined parameters and in response to signals received, the controller 102 providing signals to other components of the electronic device 100, such as device-specific functional circuitry 108 (which, for example, in a cellular telephone, would include transceiver circuitry and radio frequency antenna circuitry) and user interface devices 110 including one or more of functional keys 112 (e.g., a keypad, an on/off switch, a keyboard), a display 114, a microphone 116 or a speaker 118).

The memory 104 is a nonvolatile memory such as a Flash memory which stores executable code retrievable by the controller 102 upon powering-up the electronic device 100 and providing the predefined parameters for the operation of the controller 102 in accordance with the function of the electronic device 100. In addition, the memory 104 stores data which may include factory-programmed data or data generated by the controller 102 and nonvolatilely stored in the memory 104.

Power control circuitry 120 operates under the control of signals from the controller 102 and provides power to the various components of the electronic device 100, such as the memory 104 which needs power to perform functions such as program, read or erase. In accordance with an embodiment of the present invention, the memory 104 is a high performance, non-volatile memory such as ORNAND Flash memory manufactured by Spansion LLC of Sunnyvale, Calif. The programming of the high performance Flash memory 104 has a programming speed substantially higher than the conventional non-volatile memories (e.g. conventional NOR type Flash memory) and is performed by applying a high gate voltage to the control gate word line of the Flash memory cells being programmed while, at the same time, applying another high voltage less than the high gate voltage to the bitline of such cells.

Traditionally, high current power supply is delivered from in-chip high voltage pumps called drain pumps. As the current capability increases, the silicon area and power required by the drain pumps becomes inhibitally large, affecting the overall performance of the memory 104 chip. In accordance with the embodiment of the present invention, an external off-chip high current, highly efficient high voltage power supply 122 is provided to supply a high voltage signal to the flash memory chip. The high voltage power supply 122 provides the high gate voltage such as nine to ten volts to the control gate word line of the Flash memory cells being programmed while, at the same time, applying five volts to the bitline of such cells. In order to maintain the high programming speed in accordance with the high performance of the Flash memory 104, the word line voltage can be held at the high gate voltage during programming, while the bitlines are switched to deliver the five volts and substantial programming currents to cells which are attached to the aforementioned word line and are to be programmed.

To increase efficiency of the Flash memory 104, a memory controller may be provided within the Flash memory 104 to decide whether to supply one or both of the word line high voltage and the bitline high voltage from the high voltage power supply 122 or internal drain pumps in accordance with the most efficient, high performance operational profile of the Flash memory 104. For example, during programming, the word line voltage can be held at the high gate voltage of nine to ten volts as provided from the high voltage power supply 122, while the bitlines are switched to deliver the five volts from the internal drain pumps to cells which are attached to the aforementioned word line and are to be programmed.

Figure 2:
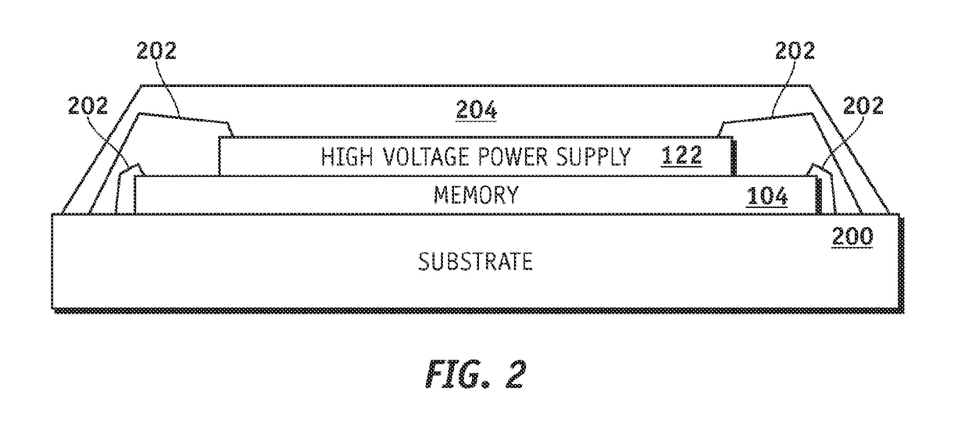
FIG. 2 is a diagram of a semiconductor package for semiconductor memory die and high voltage power supply die in accordance with an embodiment of the present invention.

In accordance with an embodiment of the present invention, the Flash memory 104 semiconductor die and a high voltage power supply 122 semiconductor die designed to work with the Flash memory 104 for providing a high performance Flash memory 104 can be packaged into a single semiconductor package 124. Referring to FIG. 2, detail of the semiconductor package 124 is a cross-sectional view thereof. The semiconductor package 124 includes a substrate 200. The Flash memory 104 die and the high voltage power supply die 122 are adhered to each other and adhered to the substrate 200. Bond wires 202 provide connection from contact pads on the dies 104, 122 to electrically conductive contact pads and patterning on the top surface of the substrate 200. The semiconductor package 124 is completed by an encapsulation material 204 applied and molded over the dies 104, 122, the wire bonds 202 and the substrate 200 to provide the top and sides of the package 124 while protecting the elements therein 104, 122, 202. In addition, additional contact pads are provided on the bottom of the substrate 200 and connected to the electrically conductive contact pads and patterning on the top surface of the substrate 200 for providing connection from the package 124 to the electronic device 100.

Figure 3:
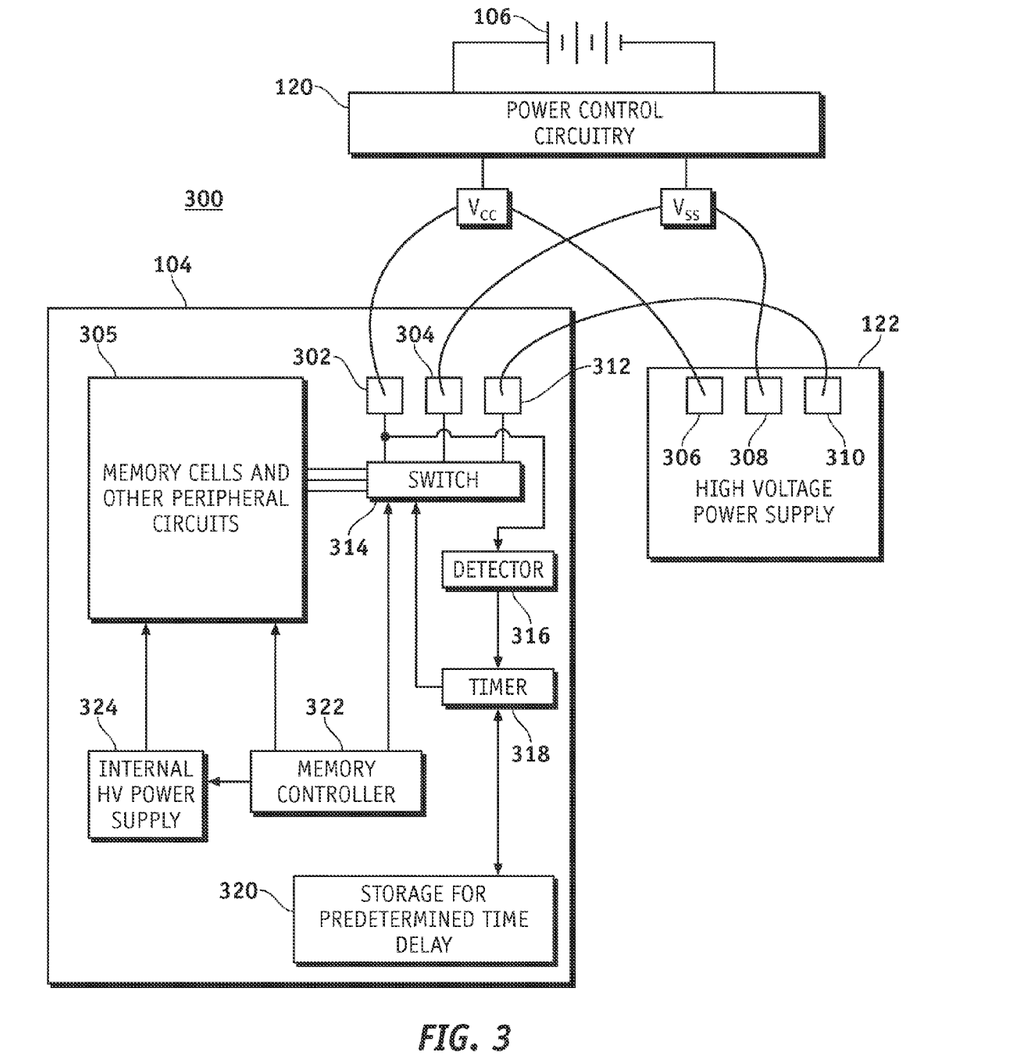
FIG. 3 is a block diagram of a semiconductor memory device and high voltage power supply source in accordance with a first embodiment of the present invention.

A first embodiment of a Flash memory device 104 and a high voltage power supply 122 arrangement 300 is depicted in FIG. 3. The Flash memory device 104 is connected to the power control circuitry 120 to receive an operational voltage (Vcc) and ground (Vss) from the energy storage device 106 at a Vcc contact pad 302 and a Vss contact pad 304 which are connected to memory cells and other peripheral circuits 305 of the Flash memory device 104. Likewise, the high voltage power supply 122 is connected to the power control circuitry 120 and receives Vcc and ground at a Vcc contact pad 306 and a Vss contact pad 308. The high voltage power supply 122 generates a high voltage signal for operation of the Flash memory device 104 and provides the high voltage signal to a High Voltage Output (HVO) contact pad 310 which is connected to an ACC contact pad 312 of the Flash memory device 104.

In accordance with the first embodiment of the present invention, a switch 314 is connected between the contact pads 302, 304, 312 and the memory cells and other peripheral devices 305 for selectably providing the high voltage signal and the operational voltage signal to the memory cells 305 for memory operations thereof. A detector 316 is coupled to the operational voltage signal for detecting a power-on period thereof and is also coupled to a timer 318 which measures a predetermined time delay interval for control of the switch 314. The predetermined time delay interval could be hardwired into the timer 318 or, as depicted in FIG. 3, the timer 318 could be coupled to a storage portion 320 for retrieving a value representing the predetermined time delay interval therefrom. The value representing the predetermined time delay interval could be determined during testing of the Flash memory 104 and could then be one time programmably stored in the nonvolatile storage portion 320.

While traditional internal Flash memory drain pumps can ramp up within several microseconds, the high voltage power supply 122, while capable of providing high efficiency, nevertheless has a slow and electrically noisy ramp up period of approximately fifty to four hundred microseconds during the initial Vcc power-on period. In other words, the power-on process of the high voltage power supply 122 introduces large fluctuations on the Vcc connected to the Vcc contact pads 302, 306. These fluctuations at the Vcc contact pad 302 may disturb the memory operations of the memory cells 305 and disrupt functionality in the memory cells and other peripheral circuits 305 due to the instability of the operational voltage signal at the Vcc contact pad 302 and the ground at the Vss contact pad 304. Accordingly, the switch 314, operates under control of the timer 318 to accommodate the electrical noise and voltage fluctuations of the off-chip high voltage power supply 122 by disconnecting the contact pads 302, 304, 312 from the memory cells and peripheral circuits 305 during the period of electrical noise and voltage fluctuations during the initial Vcc power-on period of the operational voltage signal.

In accordance with the first embodiment of the present invention, the detector 316 generates a timer activation signal in response to detecting the initial Vcc power-on period of the operational voltage signal and provides the timer activation signal to the timer 318. In response to receiving the timer activation signal, the timer 318 switches a timer signal provided to the switch 314 to high, and, in response thereto, the switch 314 opens and the timer 318 begins measuring a time delay interval. The value representing the predetermined time delay interval is retrieved from the storage 320 by the timer 318 for measuring the time delay interval. The timer 318 switches the timer signal low after the predetermined time delay interval and the switch 314, in response thereto, closes, thereby providing the high voltage signal and the operational voltage signal to the memory cells 305 for memory operations thereof. The predetermined time delay value stored in the storage 320 is a value between fifty microseconds and four hundred microseconds and, for example, can be two hundred microseconds.

In accordance with another aspect of the present invention, the Flash memory 104 may also include a memory controller 322 coupled to the memory cells 305 to control at least a portion of memory operations of the memory cells 305. An internal high voltage power supply 324 coupled to the memory controller 322 is also provided. During memory operations of the Flash memory 104, the memory controller 322 can advantageously determine whether to supply the high voltage signal to the memory cells for the high voltage operations thereof from the external high voltage power supply 122 or the internal high voltage power supply 324. The memory controller 322 is also coupled to the switch 314 and signals the switch to connect the external high voltage power supply 122 to the memory cells in response to determining to supply the high voltage signal for the high voltage operations from the external high voltage power supply 122.

Figure 4:
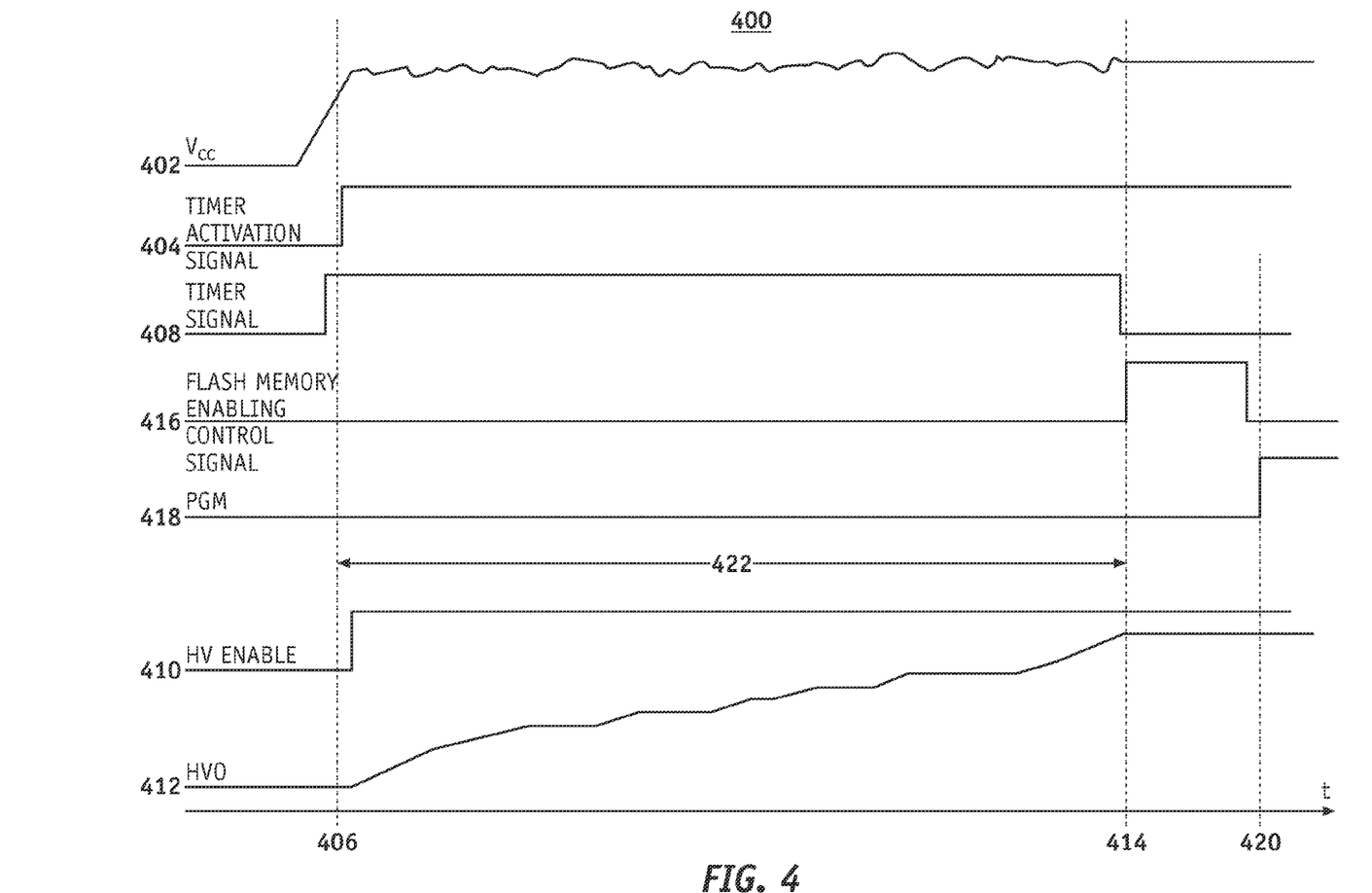
FIG. 4 is a timing diagram of a method for utilization of the high voltage power supply source in accordance with the first embodiment of the present invention.

Referring to FIG. 4, a timing diagram 400 of a method for utilization of the high voltage power supply source in accordance with the first embodiment of the present invention shows the Vcc voltage 402. The detector 316 is connected to Vcc and the timer activation signal 404 of the detector 316 goes high at a time 406 in response to detecting Vcc ramp up during the initial Vcc power-on period. Thus, at time 406, the detector 316 activates the timer 318 whose timer signal 408 goes high at the time 406 to measure the predetermined time delay interval.

A high voltage power supply enable signal 410 also goes high in response to detecting the Vcc ramp up during the initial Vcc power-on period, thereby activating the high voltage power supply 122. The high voltage output (HVO) signal 412 then begins the slow and electrically noisy ramp up period, the electrical noise of the HVO signal 412 causing fluctuations on the Vcc voltage 402.

At a time 414, the timer 318 has completed measuring the predetermined time delay interval and the timer signal 408 goes low, signaling the timer 318 to provide an enabling control signal 416 to the switch 314. Thus, the Flash memory operation of the memory cells and other peripheral circuits 305 is disabled while the global VCC power 402 is ramping up at the time 406 until the HVO signal 412 is stable at the time 414. Then, the noise on the global Vcc/Vss subsides, and in accordance with a Flash memory program signal 418 or other Flash memory operational signal, Flash memory operations are enabled after a time 420 allowing the Flash memory device 104 to function with the off-chip high voltage power supply 122, thereby advantageously enabling high efficiency programming without introducing voltage fluctuations in such memory operations. The predetermined time delay interval 422 corresponds to the value stored in the storage portion 320 and is the time that the Flash memory operations are disabled.

Figure 5:
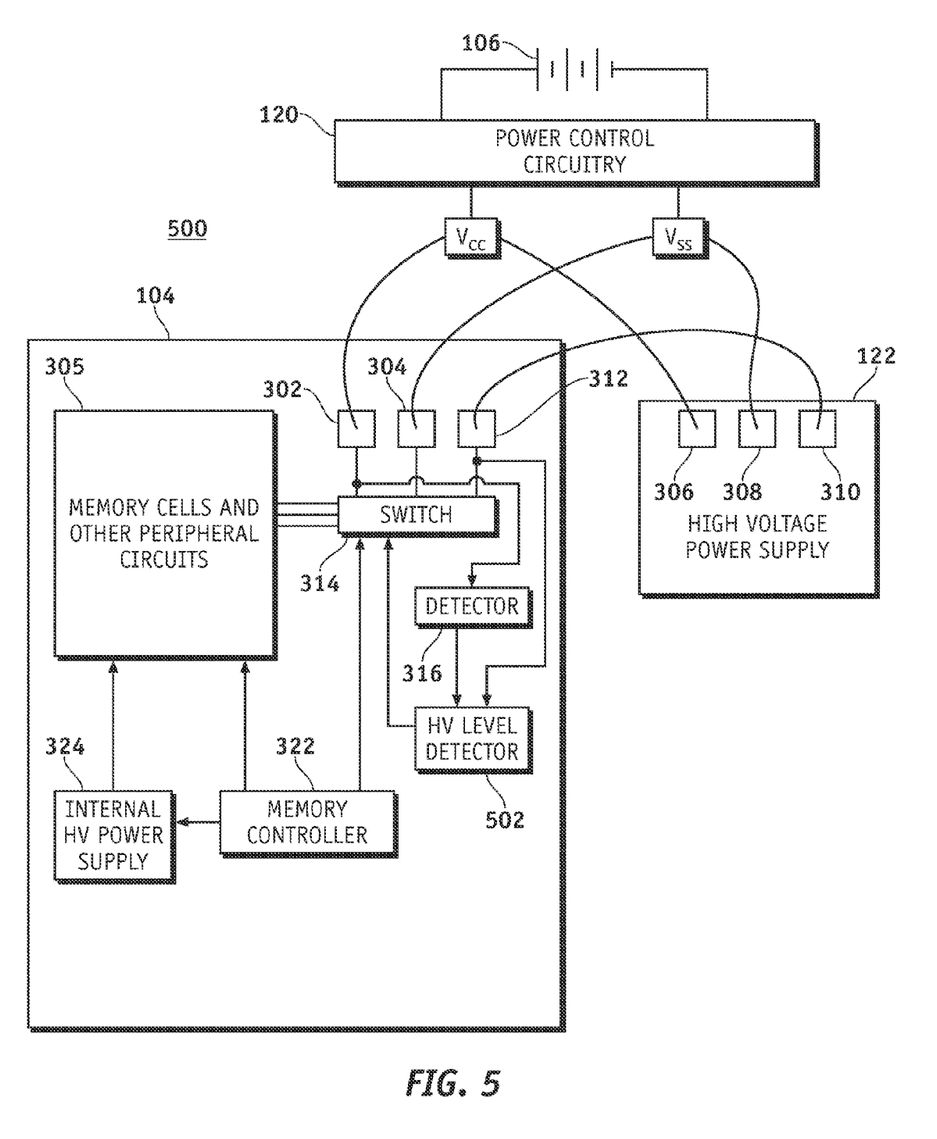
FIG. 5 is a block diagram of a semiconductor memory device and high voltage power supply source in accordance with a second embodiment of the present invention.

Referring to FIG. 5, a second embodiment of the Flash memory device 104 and the high voltage power supply 122 arrangement 500 is depicted. Instead of utilizing timer 318 to measure a predetermined time delay interval, in accordance with the second embodiment, a high voltage (HV) level detector 502 is provided. The HV level detector 502 is a stable high voltage signal detector that is connected to the high voltage signal from contact pad 312. When the detector 316 detects the initial Vcc power-on period, the detector 316 provides a HV detect activation signal to the HV level detector 502. In response thereto, the HV level detector which provides a signal to the switch 314 to open the connection between the operational voltages from the contact pads 302, 304, 312 and the memory cells and other peripheral circuits 305. The HV level detector 502 monitors the high voltage signal to detect stabilization thereof. In response to detection of stabilization of the high voltage signal, the HV level detector 502 generates a stable voltage signal and provides the stable voltage signal to the switch 314 to recouple the high voltage signal, the operational voltage signal and ground to the memory cells 305 for performing memory operations. Therefore, only a minimum number of circuits in the memory cells and other peripheral circuits 305 are potentially affected by the Vcc/Vss fluctuations due to the noise of the off-chip high voltage power supply 122 ramping up.

Figure 6:
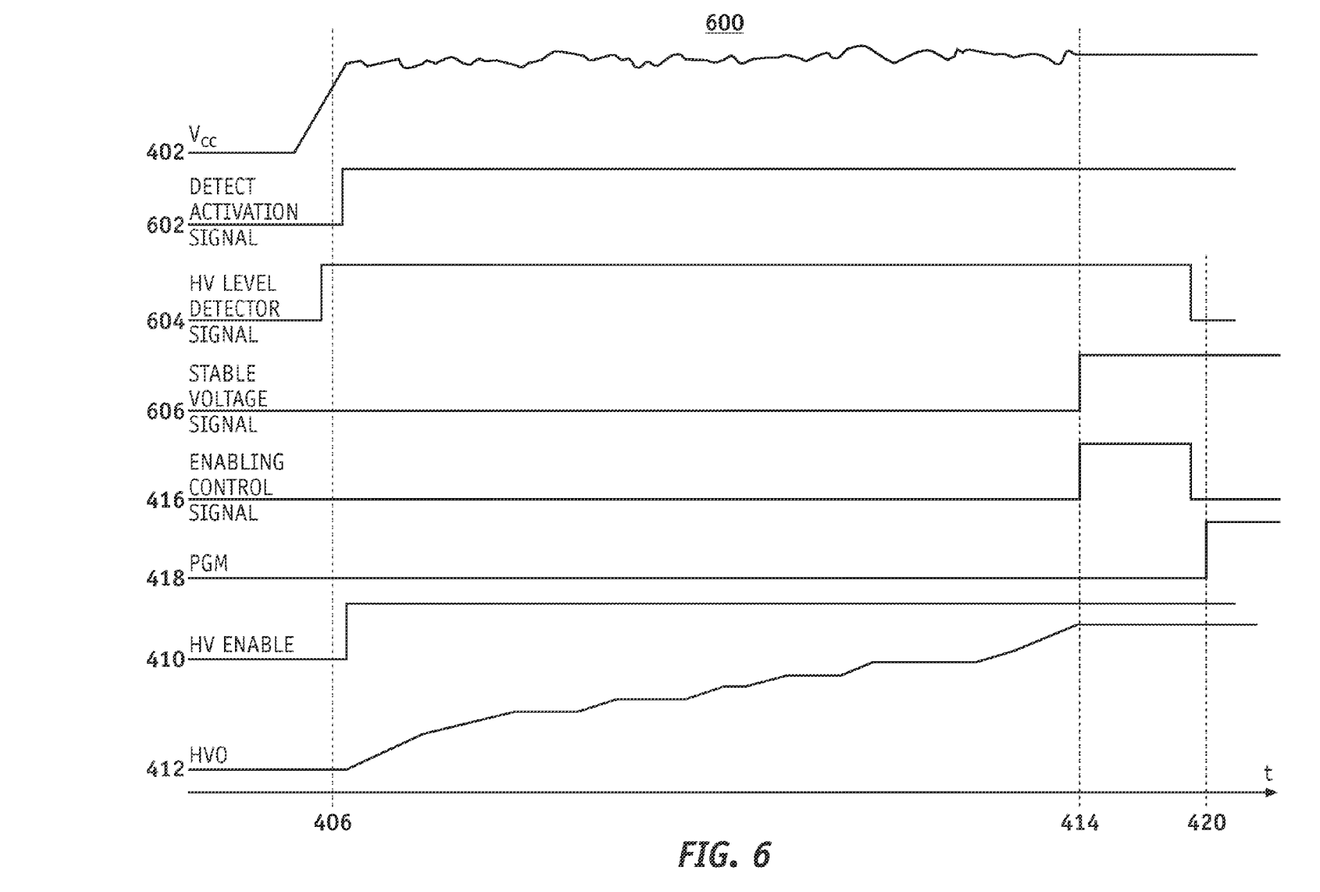
FIG. 6 is a timing diagram of a method for utilization of the high voltage power supply source in accordance with the second embodiment of the present invention.

Referring to FIG. 6, a timing diagram 600 of a method for utilization of the high voltage power supply source in accordance with the second embodiment is depicted where like signals and like times as depicted in the timing diagram 400 are labeled with the same reference numerals. As described above, the detector 316 is connected to Vcc 402 and a detect activation signal 602 goes high at a time 406 in response to detecting Vcc ramp up during the initial Vcc power-on period. The HV level detector 502 is coupled to the detector 316 and, in response to detecting the detect activation signal 602 going high, switches a HV level detector signal 604 high, the HV level detector signal being provided to the switch 314. In response to the high level HV level detector signal, the switch 314 opens and disables the Flash memory operation of the memory cells and other peripheral circuits 305.

When the HV level detector 502 detects stabilization of the high voltage signal (HVO) 412 at time 414, a high level stable voltage signal 604 is generated and provided to the switch 314. The switch 314, in response thereto, connects the operational voltages to the memory cells and other peripheral circuits 305, thereby enabling Flash memory operations after a time 420 to allow the Flash memory device 104 to function with the off-chip high voltage power supply 122 advantageously enabling high efficiency programming 418.

Accordingly, operation in accordance with the present invention enables new functionality in a Flash memory 104 design to allow utilization of an external high voltage power supply 122 for Flash memory operations providing higher performance and more efficient Flash memory operations while minimizing the effects of any noisy electrical environment generated by the external high voltage power supply 122 such as fluctuations in the operational voltages. While exemplary embodiments have been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in any exemplary embodiment without departing from the scope of the invention as set forth in the appended claims.

What is claimed is:

1. A method for performing a high voltage operation in a semiconductor memory device selectably connectable to an external high voltage power supply providing a high voltage signal thereto, the method comprising the steps of:
   detecting a power-on period of an operational voltage signal provided to the semiconductor memory device;
   waiting a time delay interval after detection of the power-on period of the operational voltage, the time delay interval determined in response to the high voltage signal; and
   connecting the high voltage signal and the operational voltage signal to memory cells of the semiconductor memory device for performing memory operations thereof.

2. The method of claim 1 wherein the step of waiting a time delay interval comprises the step of waiting a predetermined time delay interval determined in response to a value stored in a storage portion of the semiconductor memory device.

3. The method of claim 2 wherein the predetermined time delay interval is between fifty microseconds and four hundred microseconds.

4. The method of claim 3 wherein the predetermined time delay interval is approximately two hundred microseconds.

5. The method of claim 2 further comprising the step of one time programmably storing the value in the storage portion of the semiconductor memory device.

6. The method of claim 1 wherein the semiconductor memory device further includes an internal high voltage power supply, and wherein the step of activating the external high voltage power supply comprises the steps of:
   determining whether to supply the high voltage signal for high voltage memory operations in the memory cells from the external high voltage power supply or the internal high voltage power supply; and
   connecting the external high voltage power supply to the memory cells to provide the high voltage signal thereto in response to determining to supply the high voltage signal for the high voltage memory operations from the external high voltage power supply.

7. The method of claim 1 wherein the step of waiting a time delay interval comprises the steps of:
   monitoring the high voltage signal to detect stabilization of the high voltage signal; and
   determining an end of the time delay interval in response to detection of stabilization of the high voltage signal.

8. The method of claim 7 wherein the semiconductor memory device includes a stable high voltage signal detector, and wherein the step of monitoring the high voltage signal comprises the step of the stable high voltage signal detector monitoring the high voltage signal, and wherein the step of determining the end of the time delay interval comprises the step of generating a stable voltage signal in response to detection of stabilization of the high voltage signal, and wherein the step of connecting the high voltage signal to the memory cells comprises the step of connecting the high voltage signal to the memory cells for performing the memory operations thereof in response to the stable voltage signal.

9. A semiconductor memory device selectably connectable to an external high voltage power supply, the semiconductor memory device comprising:
   a switch connected to external voltage supply signals for selectably coupling the external voltage supply signals to memory cells of the semiconductor memory device for memory operations thereof, the external voltage supply signals including a high voltage signal provided from the external high voltage power supply and an operational voltage signal;
   a detector connected to the external voltage supply signals for generating a timer activation signal in response to detecting an operational voltage power-on period; and
   a timing device coupled to the detector and the switch for signaling the switch to decouple the high voltage signal and the operational voltage signal from the memory cells in response to the timer activation signal and to recouple the high voltage signal and the operational voltage signal to the memory cells a time delay interval thereafter, the time delay interval determined in response to the high voltage signal.

10. The semiconductor memory device of claim 9 wherein the time delay interval is a predetermined time delay interval, and wherein the timing device includes a timer for measuring the predetermined time delay interval in response detection of the operational voltage power-on period, the timer signaling the switch to recouple the high voltage signal and the operational voltage signal to the memory cells after the predetermined time delay interval is measured.

11. The semiconductor memory device of claim 10 further comprising a storage portion storing a value representing the predetermined time delay interval, wherein the timer is coupled to the storage portion and retrieves the value from the storage portion and measures the predetermined time delay interval in response to the value retrieved.

12. The semiconductor memory device of claim 11 wherein the predetermined time delay interval is between fifty microseconds and four hundred microseconds.

13. The semiconductor memory device of claim 12 wherein the predetermined time delay interval is approximately two hundred microseconds.

14. The semiconductor memory device of claim 9 further comprising:
   a memory controller coupled to the switch and the memory cells and controlling at least a portion of memory operations of the memory cells; and
   an internal high voltage power supply coupled to the memory controller, wherein the memory controller determines whether to supply the high voltage signal to the memory cells for the high voltage operations thereof from the external high voltage power supply or the internal high voltage power supply and signals the switch to connect the external high voltage power supply to the memory cells in response to determining to supply the high voltage signal for the high voltage operations from the external high voltage power supply.

15. The semiconductor memory device of claim 9 wherein the timing device monitors the high voltage signal to detect stabilization thereof and determines an end of the time delay interval in response to detection of stabilization of the high voltage signal.

16. The semiconductor memory device of claim 15 wherein the timing device includes a stable high voltage signal detector coupled to the high voltage power supply and generating a stable voltage signal in response to detection of stabilization of the high voltage signal, and wherein the stable high voltage signal detector provides the stable voltage signal to the switch to recouple the high voltage signal and the operational voltage signal to the memory cells for performing the memory operations thereof in response to the stable voltage signal.

17. A semiconductor package comprising:
a semiconductor memory die including memory cells and connected to an operational voltage signal; and
a high voltage power supply semiconductor die connected to the operational voltage signal for generating a high voltage signal, the high voltage power supply semiconductor die coupled to the semiconductor memory die to provide a high voltage signal to the semiconductor memory die for memory operations thereof, wherein the semiconductor memory die includes:
   a switch coupled to the high voltage power supply semiconductor die and the operational voltage signal to selectably provide the high voltage signal and the operational voltage signal to the memory cells for the memory operations thereof;
   a detector connected to the external voltage supply signals for generating a timer activation signal in response to detecting an operational voltage power-on period; and
   a timing device coupled to the detector and the switch for signaling the switch to decouple the high voltage signal and the operational voltage signal from the memory cells in response to the timer activation signal and for recoupling the high voltage signal and the operational voltage signal to the memory cells a time delay interval thereafter, the time delay interval determined in response to the high voltage signal.

18. An electronic device comprising:
a controller for controlling operations of the electronic device;
a memory coupled to the controller for storing information therein for utilization by the controller for controlling the operations of the electronic device; and
a high voltage power supply external to the memory and providing a high voltage signal to the memory for high voltage memory operations thereof, wherein the memory includes:
   a switch coupled to the high voltage power supply semiconductor die and the operational voltage signal to selectably provide the high voltage signal and the operational voltage signal to the memory cells for the memory operations thereof; and
   a detector connected to the external voltage supply signals for generating a timer activation signal in response to detecting an operational voltage power-on period; and
   a timing device coupled to the detector and the switch for signaling the switch to decouple the high voltage signal and the operational voltage signal from the memory cells in response to the timer activation signal and for recoupling the high voltage signal and the operational voltage signal to the memory cells a time delay interval thereafter, the time delay interval determined in response to the high voltage signal.

19. The electronic device of claim 18 wherein the time delay interval is a predetermined time delay interval and wherein the memory further includes a storage portion storing a value representing the predetermined time delay interval, and wherein the timing device includes a timer for measuring the predetermined time delay interval in response detection of the operational voltage power-on period, the timer signaling the switch to recouple the high voltage signal and the operational voltage signal to the memory cells after the predetermined time delay interval is measured.

20. The electronic device of claim 18 wherein the timing device includes a stable high voltage signal detector coupled to the high voltage power supply and generating a stable voltage signal in response to detection of stabilization of the high voltage signal, and wherein the stable high voltage signal detector provides the stable voltage signal to the switch to recouple the high voltage signal and the operational voltage signal to the memory cells for performing the memory operations thereof in response to the stable voltage signal.

* * * * *